US008904251B2

(12) United States Patent
Kim

(10) Patent No.: US 8,904,251 B2
(45) Date of Patent: Dec. 2, 2014

(54) SEMICONDUCTOR DEVICE AND TEST SYSTEM FOR TESTING THE SAME

(75) Inventor: Eui-Seung Kim, Hwaseong-si (KR)

(73) Assignee: Samsung Electronics Co., Ltd., Suwon-si, Gyeonggi-do (KR)

(*) Notice: Subject to any disclaimer, the term of this patent is extended or adjusted under 35 U.S.C. 154(b) by 303 days.

(21) Appl. No.: 13/414,955

(22) Filed: Mar. 8, 2012

(65) Prior Publication Data

US 2012/0233511 A1    Sep. 13, 2012

(30) Foreign Application Priority Data

Mar. 9, 2011   (KR) .................. 10-2011-0020748

(51) Int. Cl.
  *G01R 31/28*   (2006.01)
  *G01R 31/3185*  (2006.01)
(52) U.S. Cl.
  CPC .............. *G01R 31/318547* (2013.01)
  USPC ......................... 714/726; 714/733
(58) Field of Classification Search
  CPC ............. G01R 31/318335; G01R 31/318544; G01R 31/318547
  USPC ................................... 714/726, 733
  See application file for complete search history.

(56) References Cited

U.S. PATENT DOCUMENTS

| 7,493,540 | B1 | 2/2009 | Rajski et al. | |
| 7,761,761 | B2 | 7/2010 | Matsuo et al. | |
| 2004/0148554 | A1* | 7/2004 | Dervisoglu et al. | 714/727 |
| 2006/0036920 | A1* | 2/2006 | Swaminathan | 714/733 |
| 2008/0209288 | A1* | 8/2008 | Burlison et al. | 714/726 |

FOREIGN PATENT DOCUMENTS

| JP | 05-134007 A | 5/1993 |
| JP | 2007-322415 A | 12/2007 |

* cited by examiner

*Primary Examiner* — Sam Rizk
(74) *Attorney, Agent, or Firm* — Lee & Morse, P.C.

(57) ABSTRACT

A semiconductor device includes a test pattern decoding unit and a scan chain unit. The test pattern receives a scan-in pattern from an external test device and generates a test pattern based on the scan-in pattern and a scan-out pattern. The scan-in pattern is decoded based on a seed pattern and an expectation pattern. The scan chain unit performs logical operation based on the test pattern and feedbacks the scan-out pattern to the test pattern decoding unit.

19 Claims, 11 Drawing Sheets

SEMICONDUCTOR DEVICE AND TEST SYSTEM FOR TESTING THE SAME

CROSS-REFERENCE TO RELATED APPLICATION(S)

Korean Patent Application No. 10-2011-0020748, filed on Mar. 9, 2011, in the Korean Intellectual Property Office, and entitled, "Semiconductor Device and Test System for Testing the Same," is incorporated by reference herein in its entirety.

BACKGROUND

1. Field

Exemplary embodiments relate generally to scan testing for semiconductor devices, and more particularly, to a semiconductor device enabled to undergo a scan test and a test system for testing a semiconductor device.

2. Description of the Related Art

The type of semiconductor testing technique used to test a semiconductor device is as much a design/production consideration as improving density and a complexity of the semiconductor device itself. Reduction of time and cost as well as improvement of testability is considered for mass production of semiconductor devices. Thus, a design-for-testability (DFT) scheme is widely used to improve efficiency of testing during a design phase of the semiconductor device. Scan tests have been important as one of the DFT schemes for testing the semiconductor devices.

SUMMARY

One or more embodiments provide a semiconductor device configured to perform a scan test more efficiently than conventional semiconductor devices.

One or more embodiments provide a test system for performing a scan test on a semiconductor device more efficiently than conventional test systems.

One or more embodiments enable a scan test to be efficiently performed on a DUT by decoding a scan-in pattern and a fed back scan-out pattern corresponding to a result of scan performed on the DUT without requiring an I/O driver and pad for outputting the scan-out pattern to an external test device.

One or more embodiments provide a semiconductor device including a test pattern decoding unit and a scan chain unit. The test pattern receives a scan-in pattern from an external test device and generates a test pattern based on the scan-in pattern and a scan-out pattern. The scan-in pattern is decoded based on a seed pattern and an expectation pattern. The scan chain unit performs a logical operation based on the test pattern and feedbacks the scan-out pattern to the test pattern decoding unit.

In some embodiments, test pattern decoding unit may include a decoding block that performs a decoding on the scan-in pattern and the scan-out pattern to generate a decoded seed pattern, and a selection block that selects one of the decoded seed pattern and the scan-in pattern as the test pattern in response to a decoding control signal.

The scan-in pattern may be generated by performing an XOR operation on the seed pattern and the expectation pattern, and the decoding block may generate the decoded seed pattern by performing an XOR operation on each bit of the scan-in pattern and each bit of the scan-out pattern.

In some embodiments, test pattern decoding unit may include a selection block which selects one of a zero pattern and the scan-out pattern in response to a decoding control signal; and a decoding block which performs a decoding on the scan-in pattern and an output of the selection block. Each bit of the zero pattern may have logic low level.

In some embodiments, the test pattern decoding unit may output the seed pattern when the scan-out pattern matches with the expectation pattern, and the test pattern decoding unit may output a pattern different from the seed pattern when the scan-out pattern does not match with the expectation pattern.

In some embodiments, the scan chain unit may selectively feed back the scan-out pattern to the test pattern decoding unit or perform the logical operation in response to a scan mode signal.

The scan chain unit may perform the logical operation based on the test pattern during a normal operation mode with the scan mode signal being disabled, and the scan chain unit may output a result the logical operation as the scan-out pattern in synchronization with a scan clock during a scan mode with the scan mode signal being enabled.

In some embodiments, the semiconductor device may further include a feedback line through which the scan-out pattern is fed back to the test pattern decoding unit in synchronization with a scan clock.

In some embodiments, the semiconductor device may further include a single pad, and the test pattern decoding unit may receive the scan-in pattern through the single pad from the external test device.

In some embodiments, the semiconductor device may further include a pass/fail checking unit that determines whether logic circuits included in the scan chain unit have defects by accumulatively comparing logic levels of a final scan-out pattern, and the scan chain unit may provide the final scan-out pattern to the pass/fail checking unit after the scan chain unit performs a scan based on a plurality of seed patterns.

The semiconductor device may be a device under test (DUT) and the test pattern decoding unit and the scan chain unit may be internal to the DUT. The pass/fail checking unit may be internal to the DUT.

One or more embodiments provide a test system including a test device which generates a scan-in pattern encoded based on a seed pattern and an expectation pattern and at least one device under test (DUT). The at least one DUT includes a test pattern decoding unit that receives the scan-in pattern from the test device, and generates a test pattern based on the scan-in pattern and a scan-out pattern, and a scan chain unit that performs logical operation based on the test pattern and feeds the scan-out pattern to the test pattern decoding unit.

In some embodiments, the test device may include a pattern selection block that selects one of the seed pattern and a zero pattern as a first pattern in response to a seed selection signal, and may select one of the expectation pattern and the zero pattern in response to an expectation selection signal, and an encoding block that performs an encoding on the first pattern and the second pattern to generate the scan-in pattern. Each bit of the zero pattern may have logic low level.

The seed pattern may include first through Nth seed patterns, the expectation pattern may include first through Nth expectation patterns, the scan-in pattern may include first through (N+1)th scan-in patterns, the scan-out pattern may include first through (N+1)th scan-out pattern, and the test pattern may include first through (N+1)th test patterns. N maybe an integer equal to or greater than two.

The test pattern encoding unit may generate the first scan-in pattern by performing an encoding on the first seed pattern and the zero pattern, generate the nth scan-in pattern by performing an encoding on the nth seed pattern and the (n−1)th expectation pattern, and generate the (N+1)th scan in pattern by performing an encoding on the zero pattern and the Nth expectation pattern, wherein the test pattern decoding unit may decode the nth seed pattern depending on whether the (n−1)th expectation pattern matches with the (n−1)th scan-out pattern generated by the scan chain unit in response to the (n−1)th seed pattern and provide the scan chain unit with the decoded nth seed pattern as the nth test pattern, where n may be one of two through N.

The at least one DUT may further include a pass/fail checking unit which determines whether any of the logic circuits included in the scan chain unit have defects by accumulatively comparing logic levels of the (N+1) scan-out pattern corresponding to a result of a scan performed on the scan chain unit based on the Nth test pattern.

One or more embodiments provide a semiconductor device configured to undergo scan testing, the semiconductor device including a test pattern decoding unit configured to receive a scan-in pattern from an external test device, and configured to generate a test pattern based on the scan-in pattern and a scan-out pattern, and a logic circuit configured to generate the scan-out pattern by performing a logical operation on the test pattern and to feedback the scan-out pattern to the test pattern decoding unit.

The test pattern decoding unit and the logic unit may be integral to the semiconductor device.

The scan-in pattern may be decoded based on a seed pattern and an expectation pattern.

The test pattern decoding unit and the logic circuit are configured to self-check such that when the scan-out pattern matches the expectation pattern, the respective test pattern generated by the test pattern decoding unit for a subsequent scan test is the same as the seed pattern.

BRIEF DESCRIPTION OF THE DRAWINGS

Features will become apparent to those of ordinary skill in the art by describing in detail exemplary embodiments with reference to the attached drawings in which.

DETAILED DESCRIPTION OF THE EMBODIMENTS

Figure 1:
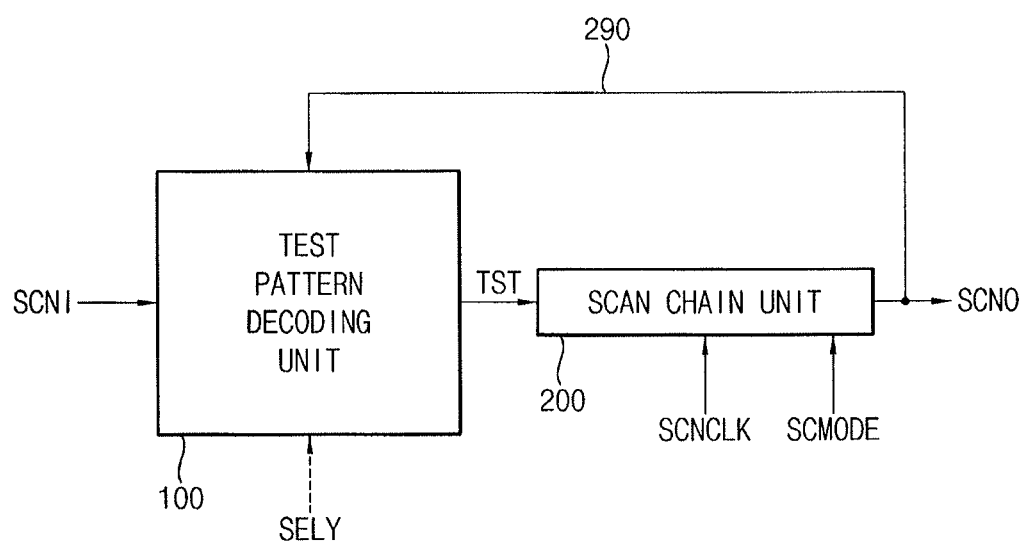
FIG. 1 illustrates a block diagram of an exemplary embodiment of a semiconductor device.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

It will be understood that, although the terms first, second, third, etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. Like reference numerals refer to like elements throughout.

FIG. 1 illustrates a block diagram of an exemplary embodiment of a semiconductor device 10.

Referring to FIG. 1, the semiconductor device 10 may include a test pattern decoding unit 100 and a scan chain unit 200. The semiconductor device 10 may receive a scan-in pattern SCNI from an external test device (not illustrated) to generate a scan-out pattern SCNO corresponding to a pattern of arithmetic operation results of logic circuits, e.g., combinational logic circuits, included in the semiconductor device 10. The semiconductor device 10 may receive the scan-in pattern SCNI from the external test device to generate a test pattern by decoding a seed pattern (SD, refer to FIG. 9) that is applied to the logic circuits to perform a scan test using the scan-out pattern SCNO. The semiconductor device 10 may generate the test pattern by decoding the test pattern corresponding to the seed pattern based on the scan-out pattern SCNO instead of outputting the scan-out pattern SCNO externally through an extra pad different from an input pad (PAD, refer to FIG. 2) through which the scan-in pattern SCNI is received. One or more embodiments of the semiconductor device 10 may perform high-speed scan testing without including an input/output (I/O) driver and an I/O pad for providing the scan-out pattern SCNO to the external test device.

For testing a semiconductor device including complicated logic circuits, various DFT schemes are adopted. A scan scheme is one widely known DFT scheme, and the scan scheme uses a scan chain that is implemented with storage elements and operates as a shift register. The test pattern is applied to the storage elements, and the scan-out pattern SCNO is read from the storage elements. These series of operations may be referred to as a scan chain. The scan chain may operate in a scan mode when the scan chain operates as a shift register in synchronization with a scan clock for performing the scan test.

The semiconductor device 10 may operate in various modes. For example, the semiconductor device 10 may operate in the scan mode and a normal operation mode. The semiconductor device 10 may test the logic circuits included in the semiconductor device 10 using the scan mode and the normal operation mode, alternatively.

The semiconductor device 10 may further include a feedback line 290. The scan chain unit 200 may apply the scan-out pattern SCNO to the test pattern decoding unit 100 through the feedback line 290. That is, the scan-out pattern SCNO may be fed back to the test pattern decoding unit 100 through the feedback line 290.

The test pattern decoding unit 100 may receive the scan-in pattern SCNI from the external test device. The scan-in pattern SCNI may be decoded by the external test device based on the seed pattern (SD) and an expectation pattern (EP, refer to FIG. 9). The expectation pattern (EP) may be a pattern that is expected to be output from the scan chain unit 200 when the scan chain unit 200 normally performs a logical operation. The test pattern decoding unit 100 may generate a test pattern TST based on the scan-in pattern SCNI and the scan-out pattern SCNO. The test pattern TST may be a pattern that is expected to be substantially the same as the seed pattern SD that is used for generating the scan-in pattern SCNI when the logic circuits included in the scan chain unit 200 to be tested have no defects. Therefore, the test pattern decoding unit 100 may decode the scan-in pattern SCNI based on the scan-out pattern SCNO such that the test pattern TST for a next scan test may be substantially the same as the seed pattern SD when the scan-out pattern SCNO matches with the expectation pattern (EP). For example, the test pattern decoding unit 100 may output the seed pattern SD when the scan-out pattern SCNO matches with the expectation pattern (EP). For example, the test pattern decoding unit 100 may output a pattern different from the seed pattern SD when the scan-out pattern SCNO does not match with the expectation pattern (EP). In some embodiments, the test pattern decoding unit 100 may selectively decode the scan-in pattern SCNI in response to a decoding control signal SELY.

The scan chain unit 200 may perform logical operations based on the test pattern TST and feed back the scan-out pattern SCNO to the test pattern decoding unit 100. The scan-out pattern SCNO that is fed back may be a previous scan-out pattern corresponding to a result of logical operation of the scan chain unit 200 based on a previous test pattern.

The semiconductor device 10 may provide the scan chain unit 200 with the test pattern including one or more test patterns, sequentially. In this case, a pass/fail test may not be performed based on the scan-out pattern SCNO that is obtained in response to a set of test patterns TST, i.e., one test pattern TST. In the semiconductor device 10, the scan-out pattern SCNO may be used as data for decoding a next seed pattern SD, and thus, the semiconductor device 10 need not include an I/O driver and a pad for the scan-out pattern SCNO including a plurality of bits in response to every set of the seed pattern SD.

The scan chain unit 200 may selectively feedback the scan-out pattern SCNO to the test pattern decoding unit 100 or may perform the logical operation through the logic circuits in response to a scan mode signal SCMODE. In one or more embodiments, the scan chain unit 200 may have two or more paths controlled by the scan mode signal SCMODE. For example, in the scan mode when the scan mode signal SCMODE is enabled, the scan chain unit 200 may propagate the test pattern TST through the flip-flops in the scan chain unit 200 in synchronization with the scan clock SCNCLK through a first transmission path. For example, in the normal operation mode when the scan mode signal SCMODE is disabled, the scan chain unit 200 may transmit data between the logic circuits in the scan chain unit 200 without regard to the scan clock SCNCLK through a second data path.

In general, for performing a scan test, a test device applies seed values to be input to logic circuits to be tested, and receives a result pattern from the logic circuits after the logic circuits perform the logical operation based on the seed values. However, when the I/O driver that provides the result pattern to the test device has a low speed, an overall time for the scan test may be increased due to the low speed of the I/O driver. More particularly, when a low-speed I/O driver is employed in a smart card integrated circuit (IC), the result pattern may be provided to the test device at lower speed.

In one or more embodiments of the semiconductor device 10, since the test pattern TST associated with the seed pattern SD is generated by decoding the scan-in pattern SCNI and the scan-out pattern SCNO instead of outputting the scan-out pattern SCNO externally through the I/O driver, a result of the scan test, indicated by the scan-out pattern SCNO, may be repeatedly or sequentially reflected in the test pattern TST. In addition, since the semiconductor device 10 provides the scan chain unit 200 with the test pattern TST that is generated by performing decoding based on the scan-out pattern SCNO instead of providing the scan-out pattern SCNO through an extra pad different from the pad (PAD of FIG. 2) through which the scan-in pattern SCNI is received, the scan test may be efficiently performed on the logic circuits in the scan chain unit 200. One or more embodiments of the semiconductor device 10 may perform the scan test on the logic circuits in the scan chain unit 200, because the semiconductor device 10 needs not include an I/O driver and I/O pad for providing the scan-out pattern SCNO to an external device.

Figure 2:
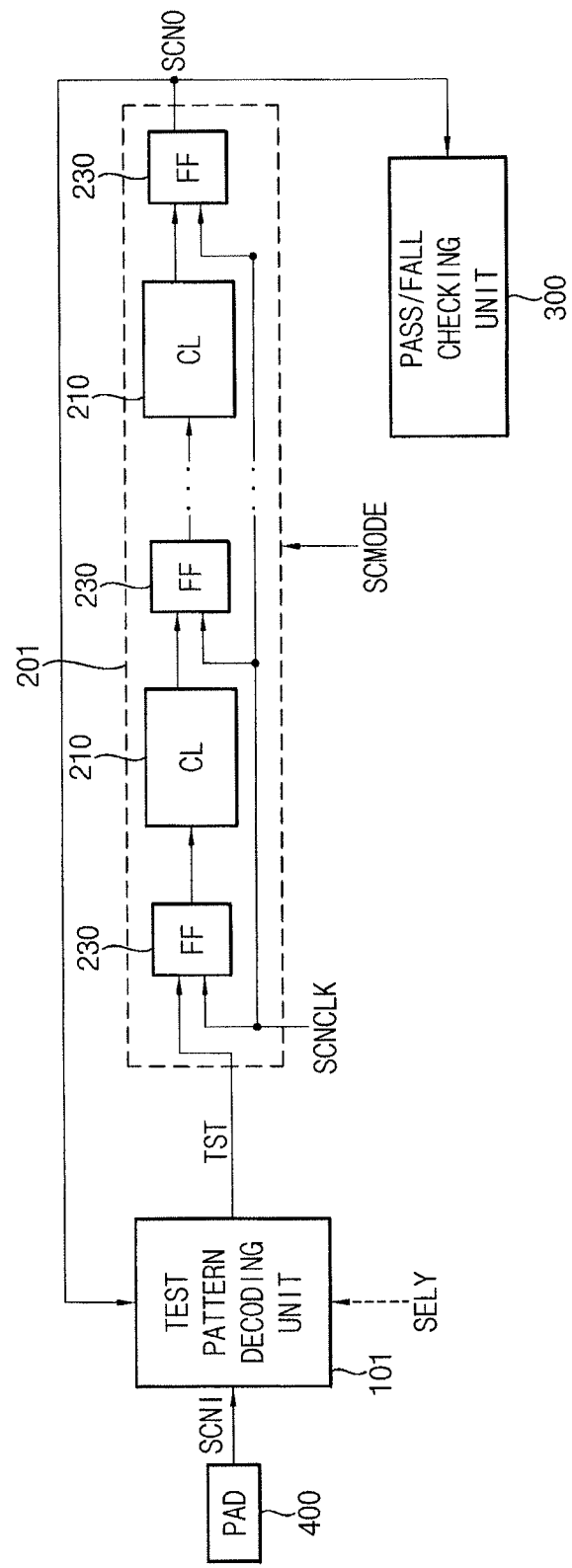
FIG. 2 illustrates a more detailed block diagram of an exemplary embodiment of the semiconductor device of FIG. 1.

FIG. 2 illustrates a block diagram of an exemplary embodiment of a semiconductor device 11.

Referring to FIG. 2, the semiconductor device 11 may include a test pattern decoding unit 101, a scan chain unit 201, a pass/fail checking unit 300, and a pad 400. The pad 400 may be a single pad for transmitting/receiving a pattern including, e.g., the seed pattern SD and the expectation pattern EP. In some embodiments, the semiconductor device 11 may include an extra pad (not illustrated) for providing the pass/fail checking of the pass/fail checking unit 300 to an external device. The test pattern decoding unit 101 may receive the scan-in pattern SCNI from an external test device.

The scan chain unit 201 may include a plurality of flip-flops 230 and a plurality of logic circuits 210. In some embodiments, the scan chain unit 201 may, e.g., be implemented with the flip-flops 230 that are connected in a shift register configuration. More particularly, in some embodiments, the flip-flops 230 may be connected in a shift register configuration, and may form a scan chain. Each of the flip-flops 230 may receive the test pattern TST and may provide the test pattern TST to of the logic circuits 210 respectively connected to the corresponding flip-flop 230. In addition, the flip-flops 230 may output each output from the former logic circuit as the scan-out pattern SCNO in synchronization with the scan clock SCNCLK. That is, the test pattern TST may be sequentially input to the logic circuits 210 via the flip-flops 230 in synchronization with the scan clock SCNCLK. Each of the logic circuits 210 may be connected between two respective ones of the flip-flops 230. For example, each of the logic circuits 210 may receive the test pattern TST in the scan mode when the scan mode signal SCMODE is enabled. For example, each of the logic circuits 210 may perform the logical operation based on the test pattern TST and output scan-out pattern SCNO in the normal operation mode when the scan mode signal SCMODE is disabled.

The semiconductor device 11 may operate in various modes. The semiconductor device 11 may operate in scan mode and in normal operation mode. In the scan mode, the test pattern TST may be input to each of the logic circuits 210 using the flip-flops 230. In the normal operation mode, each of the logic circuits 210 may output a result pattern as the scan-out pattern SCNO by performing the logical operation based on the test pattern TST. In the scan mode, the scan chain unit 201 may feedback the result pattern to the test pattern decoding unit 101 or provide the result pattern to the pass/fail checking unit 300 as the scan-out pattern SCNO using the flip-flops 230 again.

The pass/fail checking unit 300 may determine whether the logic circuits 210 have defects based on the scan-out pattern SCNO. That is, the pass/fail checking unit 300 may perform a pass/fail test on the logic circuits 210 based on the scan-out pattern SCNO. For example, the pass/fail checking unit 300 may determine whether the logic circuits 210 have defects by accumulatively comparing logic values of the scan-out pattern SCNO.

In some embodiments, the pass/fail checking unit 300 may determine whether the logic circuits 210 have defects based on a final scan-out pattern SCNO. The scan chain unit 201 may output the final scan-out pattern SCNO after performing the scan test based on a plurality of seed patterns SD. For example, when the scan test is performed based on a sequence of test patterns TST, each pattern being associated with corresponding pattern of a sequence of seed patterns SD, the scan chain unit 201 may feedback the scan-out pattern SCNO associated with the last pattern of the sequence of the test pattern TST. The test pattern decoding unit 101 may decode the scan-out pattern SCNO based on a last pattern of the expectation pattern EP to be expected according to a last pattern of the sequence of the seed pattern SD and may provide the test pattern TST to the scan chain unit 201. In this case, the pass/fail checking unit 300 may determine whether the logic circuits 210 have defects by accumulatively comparing logic values of the scan-out pattern SCNO.

In one or more embodiments, the semiconductor device 11 may determine whether the logic circuits 210 have defects internally in the pass/fail checking unit 300 instead of providing the scan-out pattern SCNO externally. Therefore, the semiconductor device 11 may reduce complexity and circuit size because the semiconductor device 11 needs not include an I/O driver and an I/O pad for providing the scan-out pattern SCNO to an external device.

As mentioned above, in one or more embodiments of the semiconductor device 11, since the test pattern TST associated with the seed pattern SD is generated by decoding the scan-in pattern SCNI and the scan-out pattern SCNO instead of outputting the scan-out pattern SCNO externally through the I/O driver, a result of the scan test, indicated by the scan-out pattern SCNO, may be repeatedly or sequentially reflected in the test pattern TST. In addition, since the semiconductor device 11 provides the scan chain unit 201 with the test pattern TST that is generated by performing decoding based on the scan-out pattern SCNO instead of providing the scan-out pattern SCNO through an extra pad different from the pad 400 through which the scan-in pattern SCNI is received, the scan test may be efficiently performed on the logic circuits in the scan chain unit 201. Therefore, the semiconductor device 11 may perform the scan test on the logic circuits 201 in the scan chain unit 201, because the semiconductor device 11 needs not include an I/O driver and I/O pad for providing the scan-out pattern SCNO to an external device.

Figure 3:
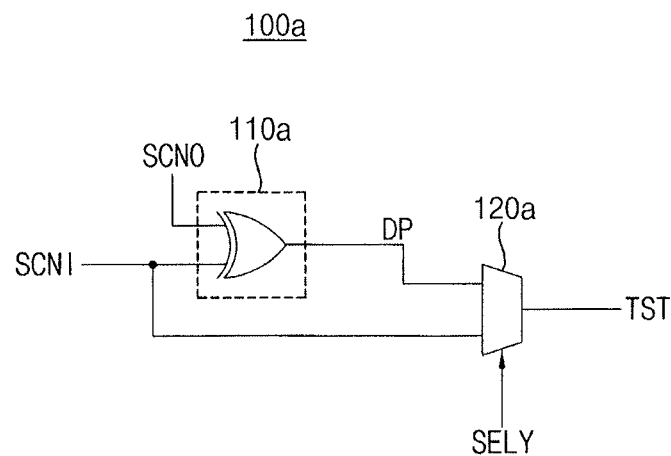
FIGS. 3 through 5 respectively illustrate exemplary embodiments of the test pattern decoding unit of FIG. 1.
Figure 4:
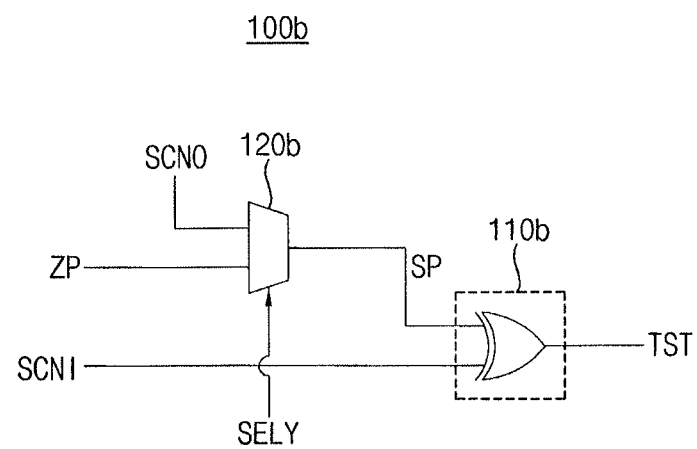
Figure 5:
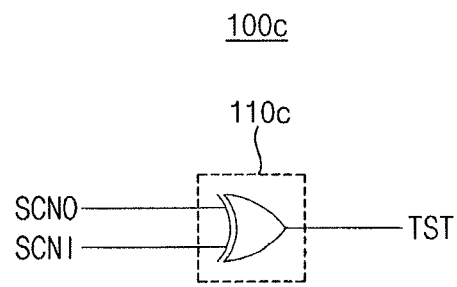

FIGS. 3 through 5 respectively illustrate exemplary embodiments of the test pattern decoding unit 100 of FIG. 1.

Referring to FIG. 3, a test pattern decoding unit 100a may include a decoding block 110a and a selection block 120a.

The decoding block 110a may perform decoding on the scan-in pattern SCNI and the scan-out pattern SCNO and output a decoded seed pattern DP. In some embodiments, the decoding may correspond to the encoding that is performed on the seed pattern SD and the expectation pattern EP by the external test device. The decoding and the encoding may correspond to an exclusive OR (XOR) operation. In such embodiments, the scan-in pattern SCNI may be generated by performing an XOR operation on the seed pattern SD and the expectation pattern EP. The decoding block 110a may generate the decoded seed pattern DP by performing an XOR operation on each bit of the scan-in pattern SCNI and each bit of the scan-out pattern SCNO. The selection block 120a may select one of the decoded seed pattern DP and the scan-in pattern SCNI as the scan-out pattern SCNO in response to the decoding control signal SELY.

Referring to FIG. 4, a test pattern decoding unit 100b may include a decoding block 110b and a selection block 120b.

The selection block 120b may select one of the scan-out pattern SCNO and a zero pattern ZP in response to the decoding control signal SELY. Each bit of the zero pattern ZP may have a logic low level (logic "0"). The decoding block 110b may perform decoding on the scan-in pattern SCNI and an output SP of the selection block 120 and output the test pattern TST.

Referring to FIG. 5, a test pattern decoding unit 110c may include a decoding block 110c. The decoding block 110c may perform decoding on the scan-in pattern SCNI and the scan-out pattern SCNO and output the test pattern TST.

Referring to FIGS. 3 through 5, in some embodiments, the decoding and/or the encoding may correspond, e.g., to an XOR operation. Various decoding and encoding schemes for recovering the seed pattern SD may be employed when the expectation pattern EP used in the encoding for generating the scan-in pattern SCNI matches with the scan-out pattern SCNO used in the decoding.

Figure 6:
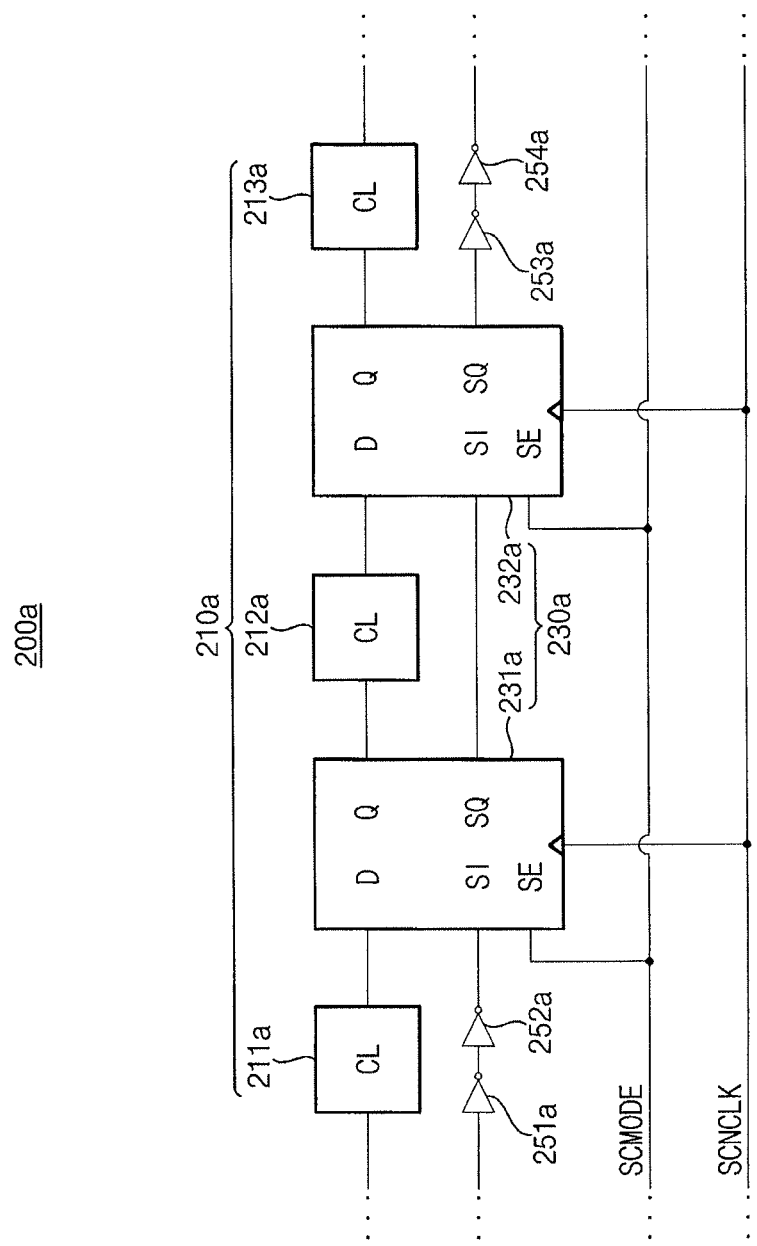
FIG. 6 illustrates an exemplary embodiment of a scan chain unit of FIG. 1.

FIG. 6 illustrates an exemplary embodiment of the scan chain unit 200 of FIG. 1.

Referring to FIG. 6, a scan chain unit 200a may include a logic circuit unit 210a and a sequential circuit unit 230a. The logic circuit unit 210a may include a plurality of combinational logic circuits 211a, 212a, 231a. The sequential circuit unit 230a may include scan flip-flops 231a, 232a. The scan chain unit 200a may further include buffers 251a, 252a, 253a, 254a. The sequential circuit unit 230a may include the scan flip-flops 231a, 232a that are connected in a shift register configuration, and may form a scan chain.

The combinational logic circuit 211a may perform a logic operation on input data to generate a data input signal D to the scan flip-flop 231a. The scan flip-flop 231a may select one of the data input signal D and a scan input signal SI depending on operation modes, may generate an output signal based on the selected signal, and may output the selected signal through selected one of a data output terminal and a scan output terminal depending on the corresponding operation modes. For example, the scan flip-flop 231a may generate a data output signal Q at the data output terminal based on the data input signal D in synchronization with the scan clock SCNCLK in the normal operation mode when the scan mode signal SCMODE is not enabled. For example, the scan flip-flop 231a may generate a scan output signal SQ at the scan output terminal based on the scan input signal SI in synchronization with the scan clock SCNCLK in the scan mode when the scan mode signal SCMODE is enabled.

The combinational logic circuit 212a may perform a logic operation on the data output signal Q of the scan flip-flop 231a and may generate and output a data input signal D to the scan flip-flop 232a. The scan flip-flop 232a may receive an output signal of the combinational logic circuit 212a as a data input signal and the scan output signal SQ of the scan flip-flop 231a as a scan input signal SI. The scan flip-flop 232a may operate in the scan mode or the normal operation mode based on a state of the scan mode signal SCMODE.

The combinational logic circuit 213a may perform a logic operation on the data output signal Q of the scan flip-flop 232a and may provide output data. In addition, the scan output signal SQ of the scan flip-flop 232a may be provided as scan output via the buffers 253a, 254a during the scan mode.

The scan chain unit 200a may perform logical operation on the input data and may provide the output data through a data path including a plurality of data output terminals in the normal operation mode, and may provide the scan output signal based on the scan input signal through a scan path including a plurality of scan output terminals in the scan operation mode.

Figure 7:
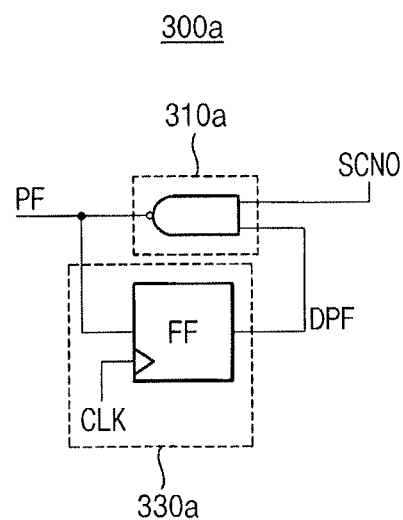
FIG. 7 illustrates a circuit diagram of an exemplary embodiment of a pass/fail checking unit in FIG. 2.

FIG. 7 illustrates a circuit diagram of an exemplary embodiment of a pass/fail checking unit in FIG. 2.

Referring to FIG. 7, a pass/fail checking unit 300a may include a logical operation unit 310a and a delay unit 330a. The pass/fail checking unit 300a may determine whether the logic circuits 210 have accumulated defects at one time.

The logical operation unit 310a may perform logical operation on the scan-out pattern SCNO and a delayed pass/fail pattern DPF for determining whether the logic circuits 210 have defects and may generate a pass/fail pattern PF. For example, logical operation unit 310a may include a NAND gate, and the logical operation unit 310a may perform a NAND operation on the scan-out pattern SCNO and the delayed pass/fail pattern DPF to generate the pass/fail pattern PF.

The delay unit 330 may delay the pass/fail pattern PF in synchronization with a clock signal CLK. For example, the delay unit 330a may include a D flip-flop.

The pass/fail checking unit 300a may disable the pass/fail pattern PF when each bit of the scan-out pattern SCNO corresponds to a first logic level (logic low level), and may enable the pass/fail pattern PF when at least one of the bits of the scan-out pattern SCNO corresponds to a second logic level (logic high level). The pass/fail checking unit 300a may determine whether the logic circuits 210 have defects by maintaining the pass/fail pattern PF at a logic low level when each bit of the scan-out pattern SCNO corresponds to a logic low level.

Figure 8:
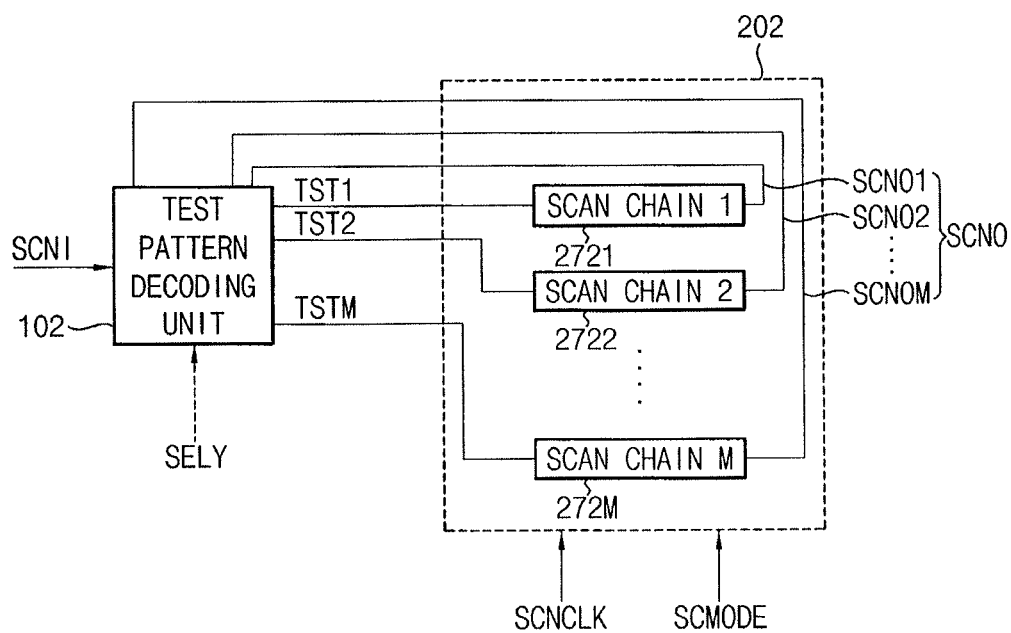
FIG. 8 illustrates a more detailed block diagram of another exemplary embodiment of the semiconductor device of FIG. 1.

FIG. 8 illustrates a more detailed block diagram of another exemplary embodiment of the semiconductor device 10 of FIG. 1.

Referring to FIG. 2, a semiconductor device 12 may include a test pattern decoding unit 102 and a scan chain unit 202.

The scan chain unit 202 may include a plurality of scan chains 2721~272M. The test pattern decoding unit 102 may receive a plurality of scan-out patterns SCNO1~SCNOM from the plurality of scan chains 2721~272M and may generate a plurality of test patterns TST1~TSTM. In some embodiments, the test pattern decoding unit 102 may sequentially generate the test patterns TST1~TSTM and may sequentially provide each of the test patterns TST1~TSTM to each of the scan chains 2721~272M, respectively. In this case, the test pattern decoding unit 102 may sequentially receive the scan-in pattern SCNI from an external test device for performing sequentially the scan test on the scan chains 2721~272M. In one or more embodiments, the test pattern decoding unit 102 may simultaneously generate the test patterns TST1~TSTM and, au provide simultaneously each of the test patterns TST1~TSTM to each of the scan chains 2721~272M to simultaneously perform the scan test on the scan chains 2721~272M.

Figure 9:
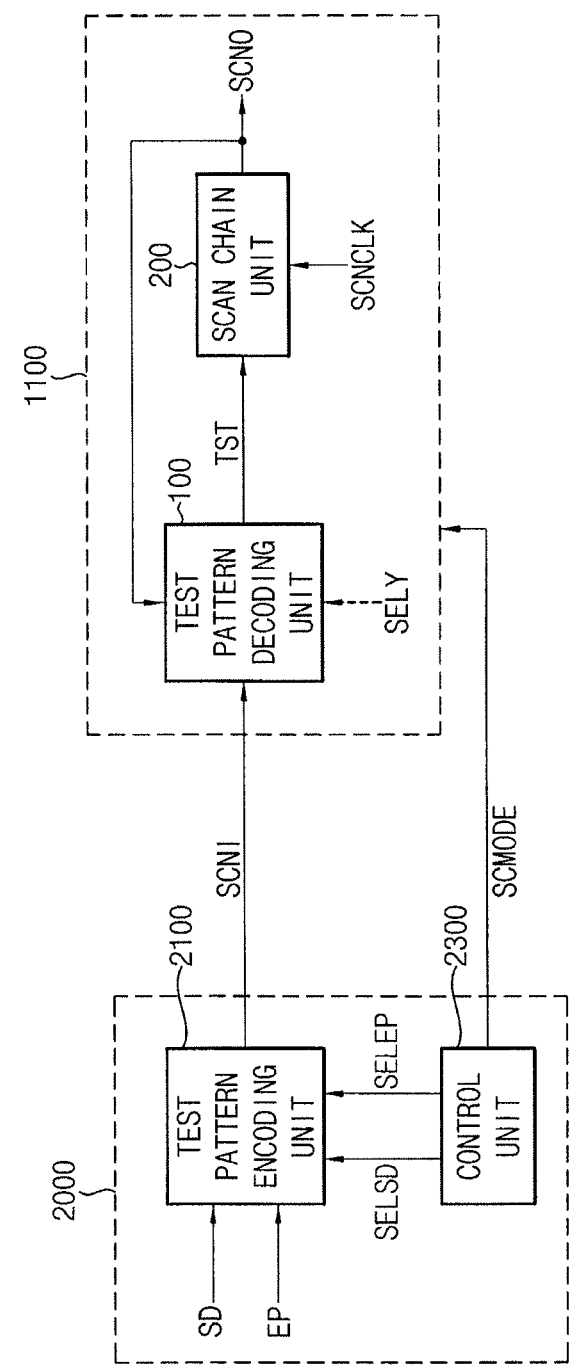
FIG. 9 illustrates a block diagram of an exemplary embodiment of a test system.

FIG. 9 illustrates a block diagram of an exemplary embodiment of a test system 1000.

Referring to FIG. 9, the test system 1000 may include a test device 2000 and a device under test (DUT) 1100. Although, one DUT 1100 is illustrated in FIG. 9, a plurality of DUTs may be connected to the test device 2000. More particularly, e.g., the DUT 1100 may correspond to the semiconductor device 10 of FIG. 1 and the DUT 1100 may include the test pattern decoding unit 100 and the scan chain unit 200.

The test device 2000 may include a test pattern encoding unit 2100 and a control unit 2300. The test pattern encoding unit 2100 may generate a scan-in pattern SCNI encoded based on the seed pattern SD and the expectation pattern EP. For example, the seed pattern SD may be generated using automatic test pattern generation (ATPG). The test pattern encoding unit 2100 may perform encoding on the seed pattern SD and the expectation pattern EP in response to a seed selection signal SELSD and may generate the scan-in pattern SCNI. The encoding may correspond to the decoding performed in the test pattern decoding unit 100. That is, the encoding may include an encryption process that is capable of being recovered by the decoding in the test pattern decoding unit 100. For example, the encoding and decoding may correspond to an XOR operation. In such embodiments, the test pattern encoding unit 2100 may include an XOR gate that performs an XOR operation on the seed pattern SD and the expectation pattern EP to generate the scan-in pattern SCNI.

The control unit 2300 may provide the test pattern encoding unit 2100 with the seed selection signal SELSD and an expectation selection signal SELEP. The control unit 2300 may generate the selection signal SELSD and the expectation selection signal SELEP depending on the operations modes such as the scan mode and the normal operation mode of the DUT 10, and for controlling the generation of the scan-in pattern SCNI in the scan mode. The control unit 2300 may further provide a scan mode signal SCMODE to the DUT 1100. For example, the DUT 1100 may receive the scan mode signal SCMODE from another external device.

The DUT 1000 may include the test pattern decoding unit 100 and the scan chain unit 200 as the semiconductor device 100 of FIG. 1. The test pattern decoding unit 100 may receive the scan-in pattern SCNI from the test device 2000, and may generate the test pattern TST based on the scan-in pattern SCNI and the scan-out pattern SCNO. The scan chain unit 200 may perform the logical operation based on the test pattern TST and may feed the scan-out pattern SCNO to the test pattern decoding unit 100. The DUT 1000 may be substantially the same as the semiconductor device 10 of FIG. 1, and thus a detailed description of the DUT 1000 will not be repeated.

As mentioned above, in one or more embodiments of the test system 1000, since the scan-in pattern SCNI may be generated by encoding the seed pattern SD and the expectation EP and the test pattern TST associated with the seed pattern SD may be generated by decoding the scan-in pattern SCNI and the scan-out pattern SCNO instead of outputting the scan-out pattern SCNO to the test device 2000 through the I/O driver, a result of the scan test, indicated by the scan-out pattern SCNO, may be repeatedly or sequentially reflected in the test pattern TST. In addition, since the test pattern decoding unit 100 provides the scan chain unit 200 with the test pattern TST that is generated by performing decoding based on the scan-out pattern SCNO instead of providing the scan-out pattern SCNO through an extra pad different from the pad (PAD of FIG. 10) through which the scan-in pattern SCNI is received, the scan test may be efficiently performed on the logic circuits in the scan chain unit 200. Therefore, the test system 1000 may perform the scan test on the logic circuits in the scan chain unit 200 because the DUT 1100 need not include an I/O driver and I/O pad for providing the scan-out pattern SCNO to the test device 2000.

Figure 10:
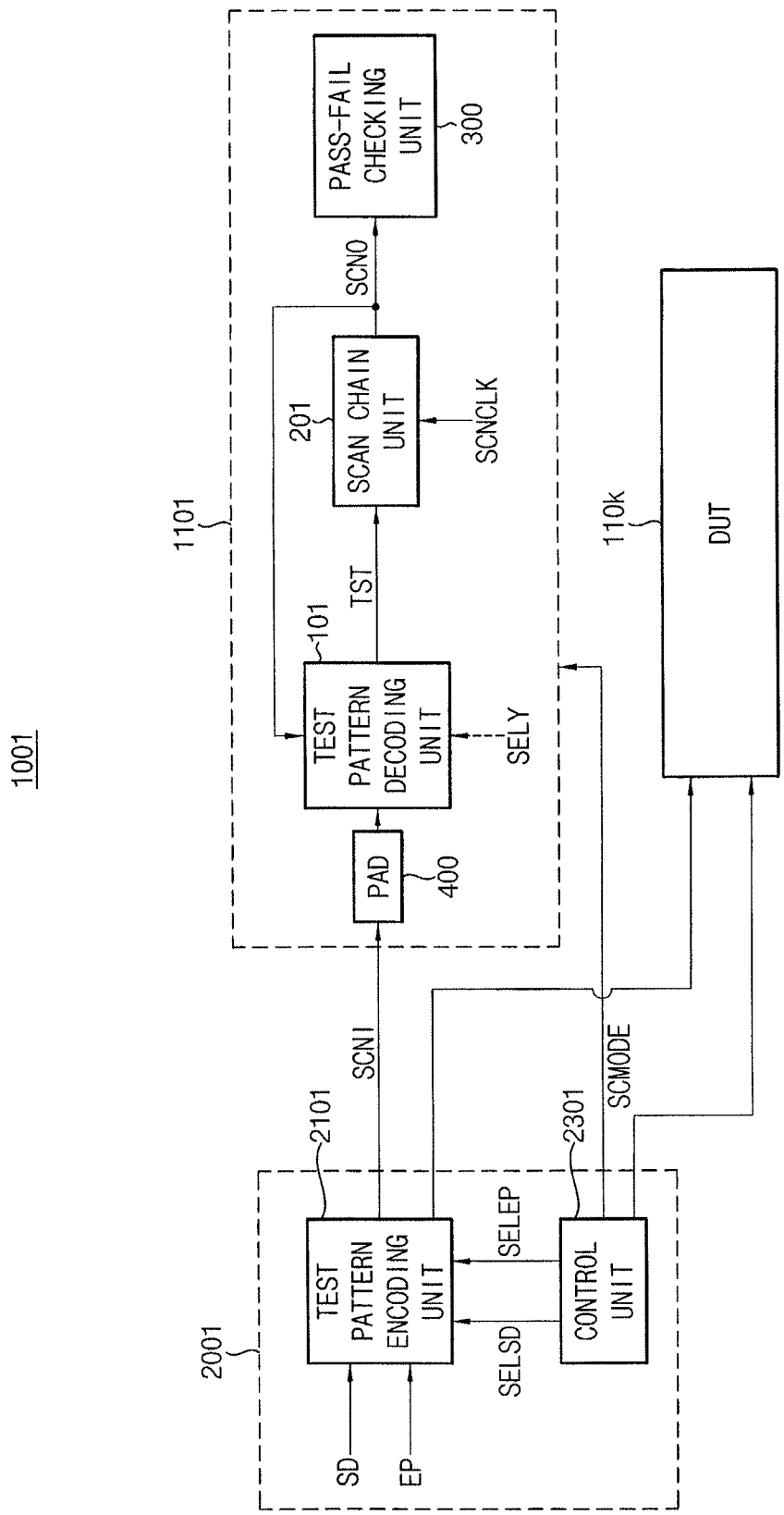
FIG. 10 illustrates a block diagram of another exemplary embodiment of a test system.

FIG. 10 illustrates a block diagram of another exemplary embodiment of a test system 1001.

Referring to FIG. 10, the test system 1001 may include a test device 2001 and a plurality of DUTs 1101~110$k$. Each of the DUTs 1101~110$k$ may be the semiconductor device 11 of FIG. 2, and the DUT 1101 may include the pad 400, the test pattern decoding unit 101, the scan chain unit 201 and the pass/fail checking unit 300. The test device 2001 may include a test pattern encoding unit 2101 and a control unit 2301. The test device 2001 may perform the scan test on the DUTs 1101~110$k$ in parallel.

The pass/fail checking unit 300 may determine whether the logic circuits in the DUT 1101 have defects. For example, the pass/fail checking unit 300 may determine whether the logic circuits in the DUT 1101 have defects by accumulatively comparing logic values of the scan-out pattern SCNO. In some embodiments, the pass/fail checking unit 300 may be external to the DUT 1101.

As mentioned above, in the test system 1001 according to example embodiments, since the scan-in pattern SCNI is generated by encoding the seed pattern SD and the expectation EP and the test pattern TST associated with the seed pattern SD is generated by decoding the scan-in pattern SCNI and the scan-out pattern SCNO instead of outputting the scan-out pattern SCNO to the test device 2001 through the I/O driver, a result of the scan test, indicated by the scan-out pattern SCNO, may be repeatedly or sequentially reflected in the test pattern TST. In addition, since the test pattern decoding unit 101 provides the scan chain unit 201 with the test pattern TST that is generated by performing decoding based on the scan-out pattern SCNO instead of providing the scan-out pattern SCNO through an extra pad different from the pad 400 through which the scan-in pattern SCNI is received, the scan test may be efficiently performed on the logic circuits in the scan chain unit 201. Therefore, the test system 1001 may perform the scan test on the logic circuits in the scan chain unit 201 because the DUT 1101 needs not include an I/O driver and I/O pad for providing the scan-out pattern SCNO to the test device 2001.

In or more embodiments, the test device 2001 may be substantially the same as the test device 2000 in FIG. 1 and the each of the DUTs 1101~110$k$ may be substantially the same as the semiconductor device 11 of FIG. 2. Thus, a detailed description of the operation of the test system 1001 will not be repeated.

Figure 11:
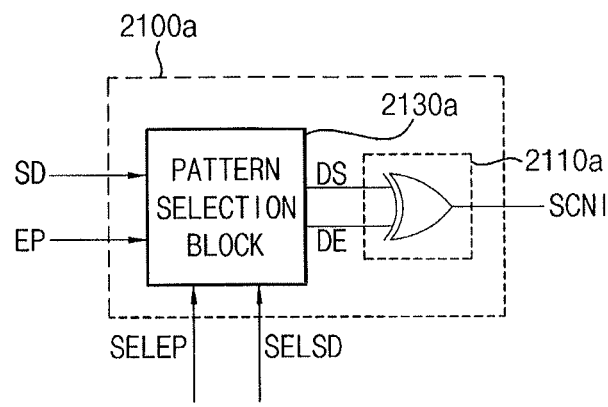
FIGS. 11 through 13 respectively illustrate exemplary embodiments of a test pattern encoding unit of FIG. 9.
Figure 12:
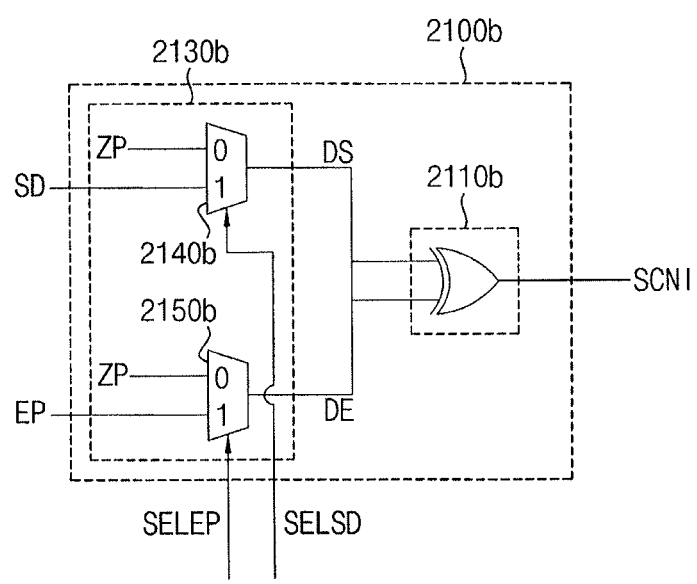
Figure 13:
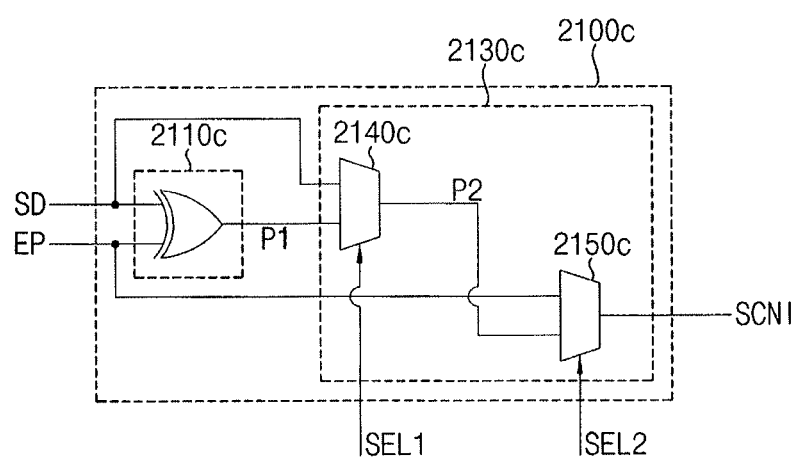

FIGS. 11 through 13 respectively illustrate exemplary embodiments of a test pattern encoding unit 2100 of FIG. 9.

Referring to FIG. 11, a test pattern encoding unit 2100$a$ may include a pattern selection block 2130$a$ and an encoding block 2110$a$.

The pattern selection block 2130$a$ may selectively output the seed pattern SD or the zero pattern ZP as a first pattern DS in response to the seed selection signal SELSD. The pattern selection block 2130$a$ may selectively output the expectation pattern EP or the zero pattern ZP as a second pattern DS in response to the expectation selection signal SELEP. The encoding block 2110$a$ may encode the first pattern DS and the second pattern DE to generate the scan-in pattern SCNI. The encoding may correspond to the decoding performed in the test pattern decoding unit 100. The encoding block 2110$a$ may perform an XOR operation on the first pattern DS and the second pattern DE to generate the scan-in pattern SCNI. The encoding block 2110$a$ may include a XOR gate.

The test pattern encoding unit 2100$a$ may be substantially similar to the test pattern encoding unit 2100 in FIG. 9, and thus, a detailed description of the test pattern encoding unit 2100$a$ will not be repeated.

Referring to FIG. 12, a test pattern encoding unit 2100$b$ may include a pattern selection block 2130$b$ and an encoding block 2110$b$.

The pattern selection block 2130$b$ may include a first selection element 2140$b$ and a second selection element 2150$b$. The first selection element 2140$b$ may selectively output the seed pattern SD or the zero pattern ZP as the first pattern DS in response to the seed selection signal SELSD. The second selection element 2150$b$ may selectively output the expectation pattern EP or the zero pattern ZP as the second pattern DS in response to the expectation selection signal SELEP. The zero pattern ZP may include a same number of bits as the seed pattern SD and/or the expectation pattern EP. Each bit of the zero pattern ZP may correspond to a logic low level.

The encoding block 2110$b$ may be substantially the same as the encoding block 2110$a$ in FIG. 11.

Referring to FIG. 13, a test pattern encoding block 2100$c$ may include a pattern selection block 2110$c$ and an encoding block 2130$c$.

The pattern selection block 2110$c$ may encode the seed pattern SD and the expectation pattern EP to generate a first pattern P1. The encoding may correspond to the decoding performed in the test pattern decoding unit 100. The encoding block 2110$c$ may perform an XOR operation on the seed pattern SD and the expectation pattern EP and may generate the first pattern P1. The encoding block 2110$c$ may include a XOR gate. The pattern selection block 2130$c$ may include a first selection element 2140$c$ and a second selection element 2150$c$. The first selection element 2140$c$ may selectively output the seed pattern SD or the first pattern P1 as a second pattern P2 in response to a first selection signal SEL1. The second selection element 2150$c$ may selectively output the expectation pattern EP or the second pattern P2 as the scan-in pattern SCNI in response to a second selection signal SEL2.

In FIGS. 11 through 13, the encoding corresponds to an XOR operation, but embodiments are not limited to an XOR encoding operation. Various encoding schemes for recovering the seed pattern SD may be employed when the expectation pattern EP used in the encoding for generating the scan-in pattern SCNI matches with the scan-out pattern SCNO used in the decoding.

Figure 14:
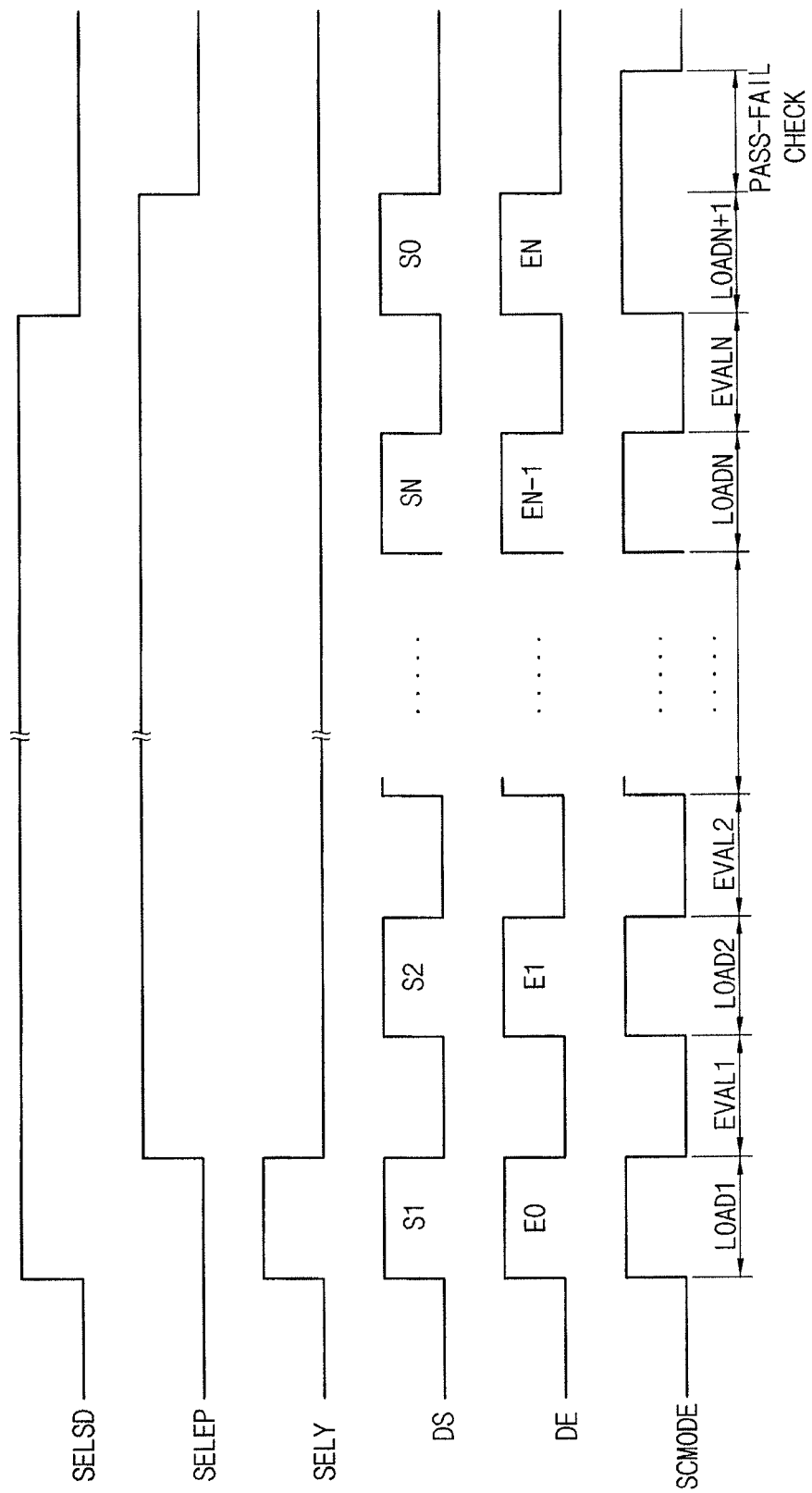
FIG. 14 illustrates an exemplary embodiment of a timing diagram employable for operating a test system.

FIG. 14 illustrates an exemplary embodiment of a timing diagram employable for operating a test system.

In FIG. 14, selection signals SELSD and SELEP respectively correspond to the seed selection signal SELSD and the expectation selection signal SELEP in FIG. 12, a control signal SELY may correspond to the decoding control signal SELY in FIG. 3, scan patterns DS and DE may respectively correspond to the first pattern DS and the second pattern DE in FIG. 12, and a mode signal SCMODE may correspond to the scan mode signal SCMODE in FIG. 9.

Referring to FIGS. 1, 3, 9 and 12, the test system 1000 or 1001 may alternatively perform first through (N+1)th loading operation LOAD1~LOADN+1 and first through Nth normal evaluation operation EVAL1~EVALN. The first through (N+1)th loading operation LOAD1~LOADN+1 may be performed in the scan mode of the semiconductor device 10 or 11, and the first through Nth normal evaluation operation EVAL1~EVALN may be performed in the normal operation mode of the semiconductor device 10 or 11. As described with reference to FIG. 2, the test pattern TST may be sequentially applied to the logic circuits 210 of the scan chain unit 201 via the flip-flops 230 in the scan mode, and the logic circuits 210 of the scan chain unit 201 perform the logical operation based on the test pattern TST in the normal operation mode. Here, N is an integer equal to or greater than two.

The test system 1000, 1001 may perform a set of scan tests on the scan chain 200, 201 using N sequential seed patterns S1~SN and N sequential expectation patterns E1~EN, each corresponding to each of the N sequential seed patterns S1~SN. Patterns S0 and E0 may be the zero pattern ZP, and each bit of the zero pattern ZP may be logic low level. The pattern selection block 2130b of FIG. 12 may output the pattern S0 in response to the disabled seed selection signal SELSD and the enabled expectation selection signal SELEP. The pattern selection block 2130b of FIG. 12 may output the pattern E0 in response to the enabled seed selection signal SELSD and the disabled expectation selection signal SELEP.

Referring to FIGS. 2, 3 10 and 12, the test system 1001 may perform a set of scan tests on the at least one DUT 1101 to generate the pass/fail pattern PF with respect to the at least one DUT 1101. After the (N+1)th loading operation is performed, the pass/fail checking unit 1300 may generate the pass/fail pattern PF.

Hereinafter, there will be description on operation of the test system 1000, 1001 when the scan test is performed on the scan chain unit 200 or 201 using the N sequential seed patterns S1~SN. In FIG. 14, the first pattern DS and the second pattern DE may be respectively selected in response to the seed selection signal SELSD and the expectation selection signal SELEP.

During the first loading operation LOAD1, the test pattern decoding unit 100 provides the scan chain unit 200 with the first seed pattern S1 corresponding to the scan-in pattern SCNI as the test pattern TST when the scan mode signal SCMODE is enabled and the decoding control signal SELY is enabled.

During the first normal evaluation operation EVAL1, the logic circuits 210 performs normal logical operation based in the first seed pattern S1 to generate an output pattern which will be fed back to the test pattern decoding unit 100 as the scan-out pattern SCNO by the scan chain unit 200 when the scan mode signal SCMODE is enabled and the decoding control signal SELY is disabled.

During the second loading operation LOAD2, the test pattern decoding unit 100 receives the scan-in pattern SCNI encoded based on the second seed pattern S2 and the first expectation E1 when the scan mode signal SCMODE is enabled and the decoding control signal SELY is disabled. The test pattern decoding unit 100 decodes the scan-out pattern SCNO reflecting a result of the first normal evaluation operation EVAL1 and the scan-in pattern SCNI to provide the test pattern TST to the scan chain unit 200. In this case, each bit of the scan-out pattern SCNO may be sequentially fed back to the test pattern decoding unit 100, and each bit of the test pattern TST may be sequentially provided (loaded) to the scan chain unit 200.

Each of the second through Nth normal evaluation operation EVAL2~EVALN may be substantially the same as the first normal evaluation operation EVAL1, and thus detailed description on the second through Nth normal evaluation operation EVAL2~EVALN will be omitted. Each of the third through (N+1)th loading operation LOAD3~LOADN+1 may be substantially the same as the second normal loading operation LOAD2, and thus detailed description on the third through (N+1)th loading operation LOAD3~LOADN+1 will be omitted.

After the logic circuits 210 performs the Nth normal evaluation operation EVALN, the test system 1000 or 1001 performs the (N+1)th loading operation LOADN+1. During the (N+1)th loading operation LOADN+1, the test pattern decoding unit 100 receives the scan-in pattern SCNI, for example the Nth expectation pattern EN, encoded based on the zero pattern S0 and the Nth expectation pattern EN when the scan mode signal SCMODE is enabled and the decoding control signal SELY is disabled. The test pattern decoding unit 100 decodes the scan-out pattern SCNO reflecting a result of the Nth normal evaluation operation EVALN and the scan-in pattern SCNI to provide the test pattern TST to the scan chain unit 200. When the scan-in pattern SCNI matches with Nth expectation pattern EN, the test pattern decoding provides the flip-flops 230 in the scan chain unit 200 with the test pattern TST corresponding to a result of bit-wise comparison of the Nth expectation pattern EN and the scan-out pattern SCNO reflecting the result of the Nth normal evaluation operation EVALN. In this case, each bit of the scan-out pattern SCNO may be sequentially fed back to the test pattern decoding unit 100, and each bit of the test pattern TST may be sequentially provided (loaded) to the scan chain unit 200 simultaneously.

The seed pattern SD may include the first through Nth seed patterns S1~SN, and the expectation pattern EP may include the first through Nth expectation patterns E1~EN. Here, N may be an integer greater than two. The scan-in pattern SCNI may include first through (N+1)th scan-in patterns, and the scan-out pattern SCNO may include the first through (N+1)th scan-out patterns.

The test pattern encoding unit 2100 may perform the encoding the first seed pattern S1 and the logic low expectation pattern E0 to generate the first scan-in pattern during the first loading operation LOAD1. The test pattern encoding unit 2100 may perform the encoding the nth seed pattern Sn and the n−1 expectation pattern En−1 to generate the nth scan-in pattern during the nth loading operation LOAD1. Here, n may be an integer not less than two and not more than N. The test pattern encoding unit 2100 may perform the encoding the logic low seed pattern S0 and the Nth expectation pattern to generate the (N+1)th scan-in pattern during the (N+1)th loading operation LOADN+1. Here, n is one of two through N.

The test pattern decoding unit 100 in the DUT 1100 may decode the nth seed pattern Sn depending on whether the (n−1)th expectation pattern En−1 matches with the (n−1) the scan-out pattern SCNO generated by the scan chain unit 200 in response to the (n−1)th seed pattern Sn−1 during the Nth loading operation LOADN.

The pass/fail checking unit 300 may determine whether the logic circuits in the scan chain unit 200 have defects by accumulatively comparing the bit values of the (N+1)th scan-out pattern SCNO corresponding to result of the scan performed on the scan chain unit 200 based on the Nth test pattern TST during the pass/fail checking operation PASS/FAIL CHECK because the (N+1)th scan-out pattern SCNO may be same as the test pattern TST corresponding to a result of bit-wise comparison of the Nth expectation pattern EN and the scan-out pattern SCNO reflecting the result of the Nth normal evaluation operation EVALN during the (N+1)th loading operation LOADN+1. The pass/fail checking unit 300 may provide the pass/fail pattern PF having logic low level when each bit of the (N+1)th scan-out pattern SCNO is logic low level, and may provide the pass/fail pattern PF having logic high level when at least one bit of the N+1)th scan-out pattern SCNO is logic high level. The (N+1)th scan-out pattern SCNO may be same as the test pattern TST during the (N+1)th loading operation LOADN+1. When the pass/fail pattern PF is logic low level, the DUT 1100 may be determined as passed. When the pass/fail pattern PF is logic high level, the DUT 1100 may be determined as failed.

Figure 15:
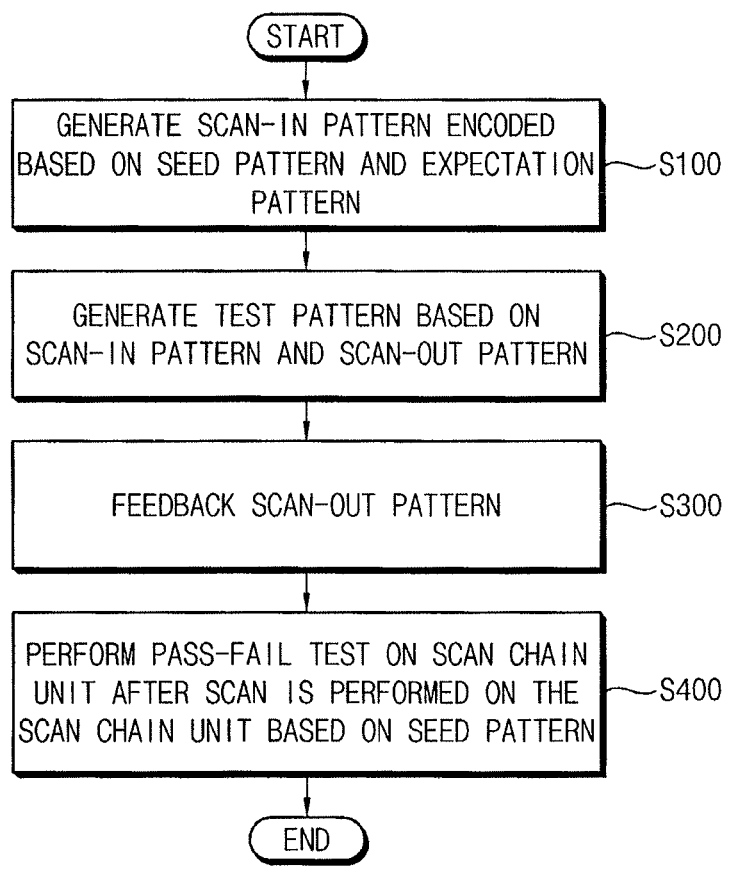
FIG. 15 illustrates a flow chart of an exemplary embodiment of a method of performing a scan test.

FIG. 15 illustrates a flow chart of an exemplary embodiment of a method of performing a scan test.

Referring to FIGS. 1, 2, 9, 10, 12 and 15, for performing a scan test on the DUT 1100, a scan-in pattern SCNI encoded based on a seed pattern SD and an expectation pattern EP is generated (S100). A test pattern TST is generated based on the scan-in pattern SCNI and the scan-out pattern SCNO fed back by a scan chain unit 200 (S200). The scan-out pattern SCNO generated based on the test pattern TST is fed back (S300). The scan-out pattern SCNO may be generated by the scan chain unit 200 in FIG. 1. Pass/fail test is performed based on the scan-out pattern SCNO after a scan is performed on the scan chain unit 200 based on at least one seed pattern SD (S400).

Steps S100~S400 may be performed by the test system 1000 or 1001 of FIG. 9 or FIG. 10, and thus detailed description on the steps S100~S400 will be omitted.

As mentioned above, in a method of scan test according to example embodiments, the scan-in pattern SCNI is generated by performing encoding based on the seed pattern SD and the expectation pattern EP, the test pattern TST associated with the seed pattern SD is generated by performing decoding based on the scan-in pattern SCNI and the scan-out pattern SCNO, and the test pattern TST is applied to the scan chain unit 200. Therefore, the scan test may be efficiently performed on the logic circuits in the scan chain unit 200.

One or more features described herein may be applied to any type of device supporting a scan test, more particularly to semiconductor memory devices, semiconductor chips, semiconductor modules, memory cards, memory sticks and smart card which employ I/O drivers whose operating speed is low.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   a test pattern decoding unit configured to receive a scan-in pattern encoded based on a seed pattern and an expectation pattern from an external test device and configured to generate a test pattern based on the scan-in pattern and a scan-out pattern; and
   a scan chain unit configured to perform a logical operation based on the test pattern, to generate the scan-out pattern, and to feedback the scan-out pattern to the test pattern decoding unit, wherein
   the test pattern decoding unit outputs the seed pattern when the scan-out pattern matches with the expectation pattern, and the test pattern decoding unit outputs a pattern different from the seed pattern when the scan-out pattern does not match with the expectation pattern.

2. The semiconductor device as claimed in claim 1, wherein the test pattern decoding unit comprises:
   a decoding block configured to perform a decoding on the scan-in pattern and the scan-out pattern to generate a decoded seed pattern; and
   a selection block configured to select one of the decoded seed pattern and the scan-in pattern as the test pattern in response to a decoding control signal.

3. The semiconductor device as claimed in claim 2, wherein the scan-in pattern is generated by performing an XOR operation on the seed pattern and the expectation pattern, and the decoding block generate the decoded seed pattern by performing an XOR operation on each bit of the scan-in pattern and each bit of the scan-out pattern.

4. The semiconductor device as claimed in claim 1, wherein the test pattern decoding unit comprises:
   a selection block configured to select one of a zero pattern and the scan-out pattern in response to a decoding control signal, each bit of the zero pattern having logic low level; and
   a decoding block configured to perform a decoding on the scan-in pattern and an output of the selection block.

5. The semiconductor device as claimed in claim 1, wherein the scan chain unit selectively feeds back the scan-out pattern to the test pattern decoding unit or performs the logical operation in response to a scan mode signal.

6. The semiconductor device as claimed in claim 5, wherein the scan chain unit performs the logical operation based on the test pattern during a normal operation mode when the scan mode signal being disabled, and the scan chain unit outputs a result of the logical operation as the scan-out pattern in synchronization with a scan clock during a scan mode when the scan mode signal being enabled.

7. The semiconductor device as claimed in claim 1, further comprising a feedback line through which the scan-out pattern is fed back to the test pattern decoding unit in synchronization with a scan clock.

8. The semiconductor device as claimed in claim 1, further comprising a single pad, wherein the test pattern decoding unit receives the scan-in pattern through the single pad from the external test device.

9. The semiconductor device as claimed in claim 1, further comprising:
   a pass/fail checking unit configured to determine whether any of the logic circuits included in the scan chain unit has a defect by accumulatively comparing logic levels of a final scan-out pattern, and wherein the scan chain unit provides the final scan-out pattern to the pass/fail checking unit after the scan chain unit performs a scan based on a plurality of seed patterns.

10. The semiconductor device as claimed in claim 9, wherein the semiconductor device is a device under test (DUT) and the test pattern decoding unit and the scan chain unit are internal to the DUT, and wherein the pass/fail checking unit is internal to the DUT.

11. The semiconductor device as claimed in claim 1, wherein the expectation pattern is a pattern to be output from the scan chain unit in a normal operation when the seed pattern is applied thereto.

12. A test system, comprising:
a test device configured to generate a scan-in pattern encoded based on a seed pattern and an expectation pattern; and
at least one device under test (DUT), the at least one DUT including:
a test pattern decoding unit configured to receive the scan-in pattern from the test device, and configured to generate a test pattern based on the scan-in pattern and a scan-out pattern; and
a scan chain unit configured to perform a logical operation based on the test pattern, to generate the scan-out pattern, and to feed the scan-out pattern to the test pattern decoding unit,
wherein the test pattern decoding unit outputs the seed pattern when the scan-out pattern matches with the expectation pattern, and the test pattern decoding unit outputs a pattern different from the seed pattern when the scan-out pattern does not match with the expectation pattern.

13. The test system as claimed in claim 12, wherein the test device comprises:
a pattern selection block configured to select one of the seed pattern and a zero pattern as a first pattern in response to a seed selection signal, and configured to select one of the expectation pattern and the zero pattern in response to an expectation selection signal, each bit of the zero pattern having a logic low level; and
an encoding block configured to perform an encoding on the first pattern and the second pattern to generate the scan-in pattern.

14. The test system claimed in claim 13, wherein the seed pattern includes first through Nth seed patterns, the expectation pattern includes first through Nth expectation patterns, the scan-in pattern includes first through (N+1)th scan-in patterns, the scan-out pattern includes first through (N+1)th scan-out patterns, and the test pattern includes first through (N+1)th test patterns, N being an integer equal to or greater than two.

15. The test system as claimed in claim 14, wherein the test pattern encoding unit generates the first scan-in pattern by performing an encoding on the first seed pattern and the zero pattern, generates the nth scan-in pattern by performing an encoding on the nth seed pattern and the (n−1)th expectation pattern, and generates the (N+1)th scan-in pattern by performing an encoding on the zero pattern and the Nth expectation pattern, and wherein the test pattern decoding unit decodes the nth seed pattern depending on whether the (n−1)th expectation pattern matches with the (n−1)th scan-out pattern generated by the scan chain unit in response to the (n−1)th seed pattern and provide the scan chain unit with the decoded nth seed pattern as the nth test pattern, n being one of two through N.

16. The test system as claimed in claim 14, wherein the at least one DUT further comprises:
a pass/fail checking unit configured to determine whether any of the logic circuits included in the scan chain unit has a defect by accumulatively comparing logic levels of the (N+1) scan-out pattern corresponding to a result of a scan performed on the scan chain unit based on the Nth test pattern.

17. A semiconductor device configured to undergo scan testing, comprising:
a test pattern decoding unit configured to receive a scan-in pattern encoded based on a seed pattern and an expectation pattern from an external test device, and configured to generate a test pattern based on the scan-in pattern and a scan-out pattern; and
a logic circuit configured to generate the scan-out pattern by performing a logical operation on the test pattern and to feedback the scan-out pattern to the test pattern decoding unit, wherein
the test pattern decoding unit outputs the seed pattern when the scan-out pattern matches with the expectation pattern, and the test pattern decoding unit outputs a pattern different from the seed pattern when the scan-out pattern does not match with the expectation pattern.

18. The semiconductor device as claimed in claim 17, wherein the test pattern decoding unit and the logic unit are integral to the semiconductor device.

19. The semiconductor device as claimed in claim 17, wherein the test pattern decoding unit and the logic circuit are configured to self-check such that when the scan-out pattern matches the expectation pattern, the respective test pattern generated by the test pattern decoding unit for a subsequent scan test is the same as the seed pattern.

* * * * *